(12) United States Patent
Imai et al.

(10) Patent No.: US 10,041,186 B2
(45) Date of Patent: Aug. 7, 2018

(54) METHOD FOR PRODUCING NITRIDE CRYSTAL

(71) Applicant: NGK INSULATORS, LTD., Aichi-prefecture (JP)

(72) Inventors: Katsuhiro Imai, Nagoya (JP); Makoto Iwai, Kasugai (JP); Masahiro Sakai, Nagoya (JP); Takanao Shimodaira, Nagoya (JP); Shuhei Higashihara, Nagoya (JP); Takayuki Hirao, Nagoya (JP)

(73) Assignee: NGK INSULATORS, LTD., Aichi-prefecture (JP)

( * ) Notice: Subject to any disclaimer, the term of this patent is extended or adjusted under 35 U.S.C. 154(b) by 58 days.

(21) Appl. No.: 15/238,945

(22) Filed: Aug. 17, 2016

(65) Prior Publication Data

US 2016/0355945 A1   Dec. 8, 2016

Related U.S. Application Data

(63) Continuation of application No. PCT/JP2015/056775, filed on Mar. 9, 2015.

(30) Foreign Application Priority Data

Mar. 10, 2014 (JP) ................. 2014-046407

(51) Int. Cl.
*C30B 9/06* (2006.01)
*C30B 9/12* (2006.01)
(Continued)

(52) U.S. Cl.
CPC ................. *C30B 9/12* (2013.01); *C30B 9/00* (2013.01); *C30B 9/06* (2013.01); *C30B 29/38* (2013.01); *C30B 29/406* (2013.01)

(58) Field of Classification Search
CPC .............. C30B 29/38; C30B 9/00; C30B 9/06
See application file for complete search history.

(56) References Cited

U.S. PATENT DOCUMENTS 7,833,347 B2   11/2010   Iwai et al.
8,187,507 B2   5/2012    Mori et al.
(Continued)

FOREIGN PATENT DOCUMENTS

JP   4538596 B2   7/2010
JP   4821007 B2   9/2011
(Continued)

OTHER PUBLICATIONS

Morishita, M., et al., "Investigation of the metastable zone in the growth of GaN single crystals using Na-based flux," Proceedings of the 36th Japan National Conference on Crystal Growth, 2006, vol. 33, No. 4, 01aA07, 1 pg.

(Continued)

*Primary Examiner* — Robert M Kunemund
(74) *Attorney, Agent, or Firm* — Cermak Nakajima & McGowan LLP; Tomoko Nakajima

(57) ABSTRACT

It is used a crucible containing a flux and a source material, a reaction vessel containing the crucible, an intermediate vessel containing the reaction vessel, and a pressure vessel containing the intermediate vessel and used to fill a gas comprising at least a nitrogen atom. When the flux and the source material are melted by heating to grow the nitride crystal, a vapor of an organic compound is provided in a space outside of the reaction vessel and inside of the intermediate vessel.

6 Claims, 2 Drawing Sheets

(51) Int. Cl.
   *C30B 29/38*   (2006.01)
   *C30B 9/00*    (2006.01)
   *C30B 29/40*   (2006.01)

(56) References Cited

U.S. PATENT DOCUMENTS

| | | | |
|---|---|---|---|
| 8,568,532 B2 | 10/2013 | Iwai et al. | |
| 2011/0012070 A2* | 1/2011 | Yamada | C30B 9/10 252/521.5 |
| 2012/0168695 A2* | 7/2012 | Yamada | C30B 9/10 252/521.5 |
| 2014/0030549 A1 | 1/2014 | Yamada et al. | |
| 2014/0197420 A1* | 7/2014 | Iwai | C30B 19/02 257/76 |

FOREIGN PATENT DOCUMENTS

| | | | |
|---|---|---|---|
| JP | 4963108 B2 | 4/2012 | |
| JP | 5187846 B2 | 2/2013 | |
| JP | 5291648 B2 | 6/2013 | |
| WO | WO2006/098458 A1 | 9/2006 | |
| WO | WO2010/143748 A1 | 12/2010 | |

OTHER PUBLICATIONS

International Search Report and Written Opinion for PCT Patent App. No. PCT/JP2015/056775 (dated May 19, 2015) with English translation of the ISR.
International Preliminary Examination Report for PCT Patent App. No. PCT/JP2015/056775 (dated Sep. 22, 2016).

* cited by examiner

METHOD FOR PRODUCING NITRIDE CRYSTAL

TECHNICAL FIELD

The present invention relates to a method for producing nitride crystals.

BACKGROUND ART

Sodium metal, which is a representative example of readily oxidizable and hygroscopic materials, reacts with oxygen and moisture in the air to produce sodium oxide and sodium hydroxide. In a process of growing nitride crystals using sodium metal as a flux component, the produced sodium oxide and sodium hydroxide are responsible for inhibiting nitridization, and thus it has been necessary that oxygen and moisture be prevented from entering the growth atmosphere.

In Patent Document 1, source powder such as Ga and Na metal are placed into a crucible inside a glove box, and then the crucible is placed into a reaction vessel, from which impurities are removed and which is sealed. Then, the reaction vessel is removed from the glove box and is placed into a growth chamber. The nitrogen gas is introduced into the growth chamber to pressurize the growth chamber, whereby the reaction vessel is unsealed and the inner atmosphere is pressurized. This method allows prevention of the source material and the Na metal from being oxidized when the crucible is transferred from the glove box to the growth chamber.

Methods for growing gallium nitride crystals by a flux method, the method including adding carbon or a hydrocarbon to a starting source to prevent nucleation and inhibit formation of undesirable crystals, are also disclosed (Patent Documents 2 and 3). It is also disclosed that prevention of nucleation can be achieved by setting the growth temperature at a temperature higher than 850° C. (Non-Patent Document 1)

However, addition of carbon to the melt in the crucible as described in Patent Document 2 promotes the growth of nonpolar planes, which is responsible for inhibiting the growth of the polar c-plane.

Sodium metal, which is the starting material, is readily oxidizable. To place the crucible into the chamber without oxidation of the material, it is preferred to use an antioxidant vessel called an inner vessel for containing the crucible. Stainless steel has been found to be suitable as a material for the inner vessel from the viewpoint of durability. However, stainless steel has a maximum heat resistance temperature of about 870° C. at which the steel has a not significantly wide metastable region, and thus precise temperature control is required to suppress undesirable nucleation. Thus, three vessels are used, and supersaturation is controlled by precisely controlling the temperature in the chamber using a three-zone heater in order to grow crystals at a moderate rate without adding carbon or a hydrocarbon to the melt in the crucible and while preventing formation of undesirable crystals (Patent Document 4).

The applicants of the present invention have disclosed that, in a process of growing gallium nitride crystals by a flux method, a material such as zeolite, a molecular sieve, or alkali metal powder is placed into a space outside of a crucible and inside of a pressure vessel to scavenge trace amounts of oxygen in the pressure vessel, thereby preventing oxidation of the melt in the crucible (Patent Document 5).

The applicants of the present invention have also disclosed that, in a process of growing gallium nitride crystals by a flux method, an opening in the lid of a reaction vessel for containing a crucible is sealed with a sealant such as paraffin wax, polyethylene, or butyl rubber in a gas-tight manner, and nitrogen is introduced by melting the sealant by heating to open the opening in the lid (Patent Document 6, para. 0059).

CITATION LIST

Patent Document

[Patent Document 1] WO2006/098458 A1
[Patent Document 2] Japanese Patent No. 4538596 B
[Patent Document 3] Japanese Patent No. 4821007 B
[Patent Document 4] WO2010/143748 A1
[Patent Document 5] Japanese Patent No. 5187846 B
[Patent Document 6] Japanese Patent No. 5291648 B

Non-Patent Document

[Non-Patent Document 1] Proceedings of the 36th Japan National Conference on Crystal Growth, 01aA07

SUMMARY OF INVENTION

However, it has been found that, in the configuration in which a crucible is placed into a reaction vessel, which is then placed into a predetermined space of an intermediate vessel and the intermediate vessel is placed into a pressure vessel, the thickness of grown nitride and the growth rate vary with the position of the reaction vessel, even if oxygen around the crucible is scavenged to prevent oxidation of the melt, and thus it is difficult to grow uniform crystals as desired.

An object of the present invention is, in a process of growing nitride crystals by placing a crucible into a reaction vessel, by placing the reaction vessel into a predetermined space of an intermediate vessel and by placing the intermediate vessel into a pressure vessel, to reduce the variation in the growth state of the nitride crystals while preventing oxidation of a solution in the crucible.

The present invention provides a method of producing a nitride crystal using a solution comprising a flux and a source material, the method including:

using a crucible containing the flux and the source material, a reaction vessel containing said crucible, an intermediate vessel containing the reaction vessel and a pressure vessel containing the intermediate vessel and used to fill a gas comprising at least a nitrogen atom; and providing a vapor of an organic compound in a space outside of the reaction vessel and inside of the intermediate vessel when the flux and the source material are melted by heating to grow the nitride crystal.

The inventors of the present invention have found that, among the three vessels described above, provision of the organic compound vapor in the space outside of the reaction vessel containing the crucible can further enhance the effect of preventing oxidation of the solution in the crucible.

It has also been found that, when a plurality of the reaction vessels that contain the crucible are, for example, stacked on top of one another, there is a variation in the growth rate of nitride crystals between the crucibles. Although the reason is not fully understood, the inventors have speculated as follows.

Under elevated pressure, hot gas tends to rise, and an upper portion of the intermediate vessel has a higher temperature. Thus, it is expected that a crucible disposed in a higher position exhibits a lower supersaturation, which may tend to reduce the growth rate. This indicates that the growth rate tends to vary with the positions in the intermediate vessel and that it is difficult to set uniform growth conditions, which creates a severe problem for mass production.

To solve the problem, it has been found, in the present invention, that provision of vapor of an organic compound having a molecular weight larger than that of nitrogen in a space outside of a reaction vessel containing a crucible and inside of an intermediate vessel reduces the variation in the growth rate of nitride crystals. The inventors consider the reason as follows. It is expected that presence of the organic compound vapor having a relatively high specific gravity in a lower portion of the space outside of the reaction vessel in the intermediate vessel suppresses vertical thermal convection and provides a uniform temperature-distribution in a vertical direction, which results in a smaller variation in the growth rate of nitride crystals.

Provision of the organic compound vapor in a space outside of the reaction vessel containing the crucible in the intermediate vessel eliminates the possibility of introduction of a carbon component into the crucible. Actually, it has been confirmed that, in a process of growing GaN crystals on a c-plane, the growth of GaN crystals on the c-plane was not inhibited.

Generally, it is well known that sodium metal is stored in kerosene to prevent the ignition. However, the present invention relates to provision of gas such as a hydrocarbon in the space outside of the reaction vessel containing the crucible to prevent oxidation of growing nitride crystals in a process of growing nitride crystals by a flux method.

Patent Document 6 describes that an opening in the lid of the reaction vessel for containing the crucible is sealed with a sealant such as paraffin wax, polyethylene or butyl rubber in a gas-tight manner, and nitrogen is provided by melting and deforming the sealant by heating to open the opening in the lid. However, such sealant is not volatile, and while the sealant seals the lid, the sealant is melted, deformed, and carbonized at elevated temperatures. Thus, unlike the present invention, the patent does not provide the idea that the space outside of the reaction vessel and inside of the intermediate vessel is filled with the vapor of an organic compound.

DESCRIPTION OF EMBODIMENTS

Now, the present invention will be described in more detail with appropriate reference to the drawings.

The present invention is directed to using a solution containing a flux and a source material to grow nitride crystals.

In particular, a crucible that contains the flux and the source material is placed into a reaction vessel, which is then placed into a pressure vessel and heated under elevated pressure. In this case, an atmosphere containing at least a nitrogen atom-containing gas is compressed to a predetermined pressure and is introduced into a pressure vessel, and the total pressure in the pressure vessel and the partial pressure of the nitrogen atom-containing gas are controlled.

Figure 1:
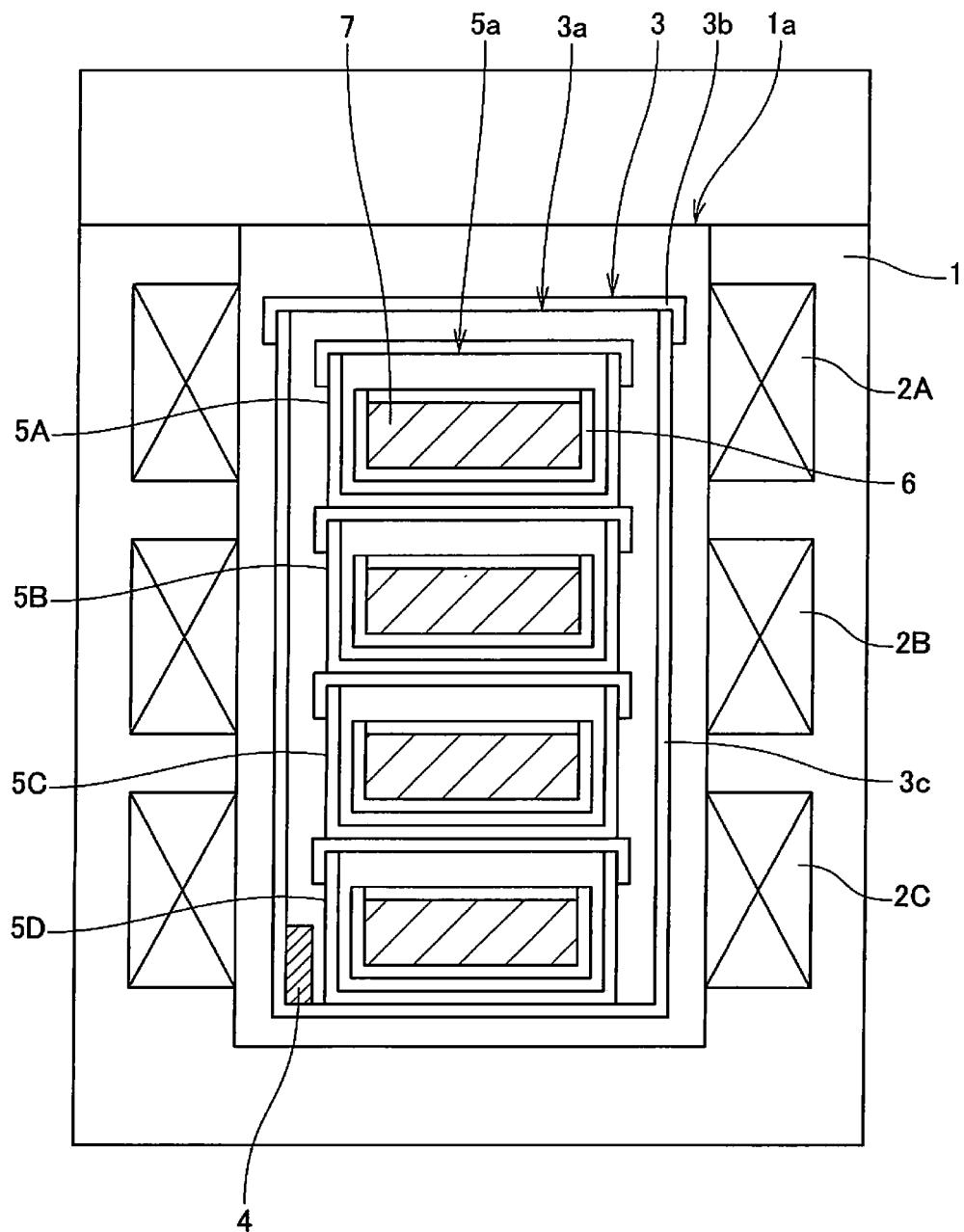
FIG. 1 is a schematic view of a device according to an embodiment of the present invention before deposition.
Figure 2:
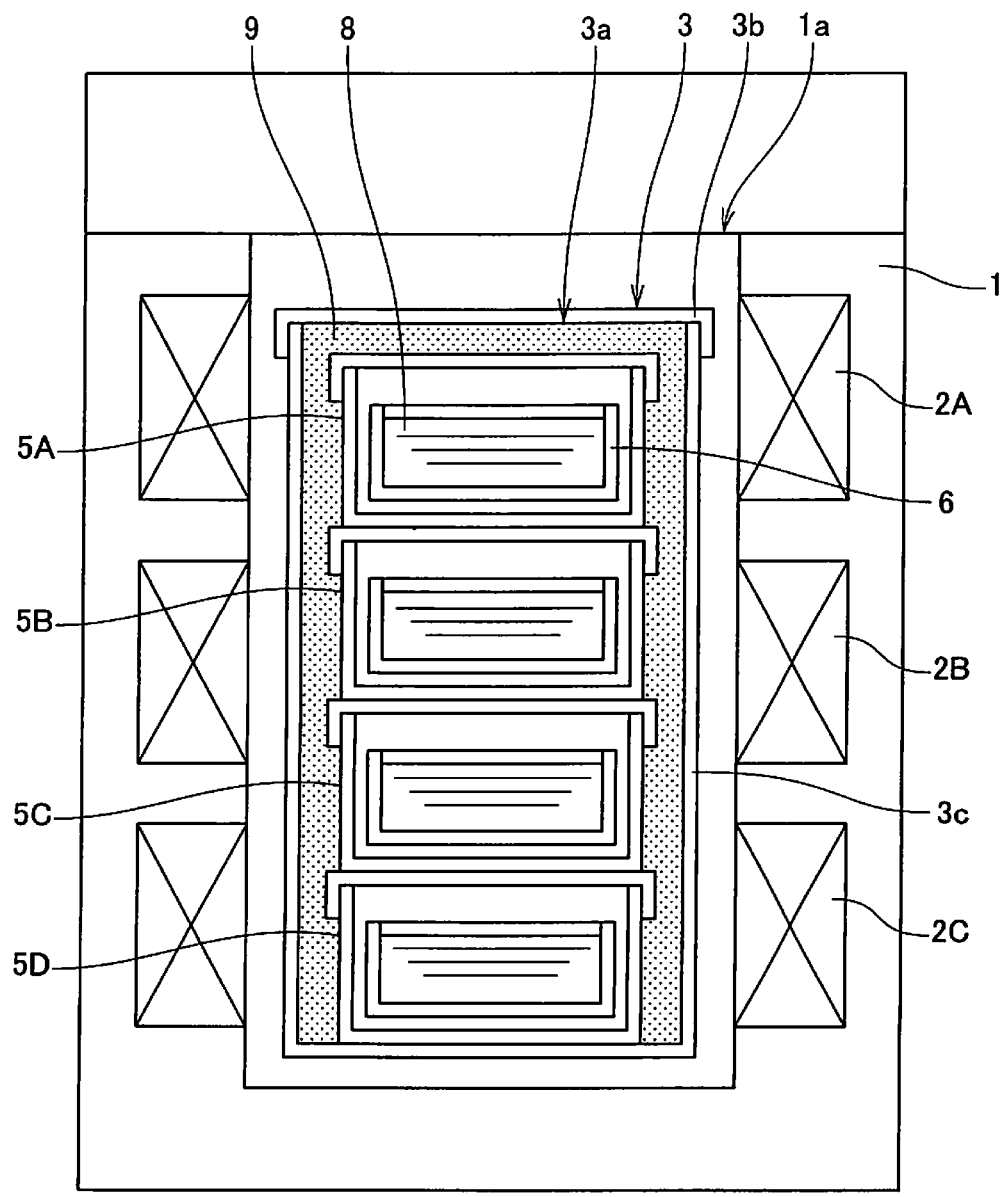
FIG. 2 is a schematic view of a device according to an embodiment of the present invention during deposition.

FIG. 1 and FIG. 2 illustrate an embodiment of the present invention.

The embodiment illustrates an example in which crystals are grown simultaneously in a plurality of crucibles.

Inside a glove box under a non-oxidizing atmosphere, a flux and a crystal source are enclosed in the respective crucibles 6. More preferably, a seed crystal substrate is disposed in the crucibles 6. Then, inside the glove box, the crucibles 6 are placed into each of interior spaces 5a of reaction vessels 5A, 5B, 5C, and 5D for transportation. Preferably, the respective reaction vessels include a body and a lid. Note that a plurality of crucibles 6 may be placed into each of the reaction vessels.

In the embodiment, for example, a particular pedestal is fixed to the interior space 1a of a pressure vessel 1 of HIP (hot isostatic pressing) apparatus, and an intermediate vessel is disposed on the pedestal. The pressure vessel 1 is formed of a combination of a body and a lid. A mixed gas cylinder (not shown) is disposed outside of the pressure vessel 1. The mixed gas cylinder is filled with mixed gas of predetermined composition. The mixed gas is compressed to a predetermined pressure by a compressor and is fed to the interior space 1a of the pressure vessel 1 through a feeding tube (not shown). A nitrogen atom-containing gas in the atmosphere functions as a nitrogen source, and an inert gas such as argon gas inhibits evaporation of the flux. The pressure is monitored by a pressure gauge (not shown).

In the embodiment, a plurality of heaters are disposed vertically in the pressure vessel and perform control functions as zone heaters. In particular, heaters 2A, 2B and 2C are disposed around the outer circumference of the intermediate vessel 3 and can control the growth temperature in the crucibles.

The reaction vessels 5A-5D containing the crucibles 6 are removed from the glove box and are transferred to the pressure vessel 1, when each of the reaction vessels is sealed to prevent oxidation of the source material in the crucibles. Then, the lid 3b of the intermediate vessel 3 is opened, and predetermined number of the reaction vessels 5A-5D are placed into the body 3c. Although four reaction vessels are disposed on top of one another in the embodiment, the number of reaction vessels is not critical. Then, the body 3c is covered with the lid 3b of the intermediate vessel 3 for starting crystal growth.

In the embodiment, an organic compound 4 is provided in a space 3a outside of the reaction vessel in the interior space of the intermediate vessel 3, as illustrated in FIG. 1. In the embodiment, the organic compound 4 is provided on the bottom surface of the body 3c of the intermediate vessel 3.

In the above state, an atmosphere that contains a nitrogen atom-containing gas is provided into the pressure vessel 1, and then the atmosphere is pressurized and heated to melt the flux and the source material 7 in the crucible, thereby producing a melt 8 as illustrated in FIG. 2. The atmosphere containing a nitrogen atom-containing gas is introduced into the melt 8 to produce nitride crystals.

To introduce the atmosphere containing a nitrogen atom-containing gas into the pressure vessel 1, a gas feeding tube (not shown) can be connected to the pressure vessel 1. Then, the atmosphere containing a nitrogen atom-containing gas in the pressure vessel 1 is introduced through between the lid 3b and the body 3c of the intermediate vessel into the interior space 3a of the intermediate vessel. After introduction into the interior space 3a of the intermediate vessel 3, the atmosphere containing a nitrogen atom-containing gas is introduced through a space between the lid and the body of the respective reaction vessels 5A-5D into the reaction vessels to provide the atmosphere to the melt in the crucibles. The details are already known and thus not illustrated in the drawings.

The organic compound is evaporated by pressurizing and heating the pressure vessel to diffuse vapor 9 of the organic compound in the interior space 3a of the intermediate vessel, as illustrated in FIG. 2. In the state, nitride crystals are grown.

The flux contains a readily oxidizable or hygroscopic material including, for example, lithium, sodium, potassium, rubidium, cesium, magnesium, strontium, and barium. Additionally, gallium, aluminum, indium, boron, zinc, silicon, tin, antimony, or bismuth, for example, can be added.

The melt contains a source material of target nitride crystals. Preferably, a group 13 element nitride can be suitably grown by a flux method. In particular, GaN, AlN, InN, mixed crystals thereof (AlGaInN), or BN is suitably grown.

For example, a flux containing at least sodium metal can be used to grow gallium nitride single crystals. A gallium source material is dissolved in the flux. Examples of the gallium source material that can be used include gallium simple metal, gallium alloys, and gallium compounds, and gallium simple metal is preferred in terms of handleability.

The flux can contain a metal other than sodium, such as, for example, lithium. Although the ratio of the gallium source material to a flux component such as sodium may be selected as desired, use of an excess amount of sodium is generally contemplated, which is, off course, not to be construed as limiting.

Examples of an aluminum source material that can be used include aluminum simple metal, aluminum alloys, and aluminum compounds, and aluminum simple metal is preferred in terms of handleability.

In a preferred embodiment, a substrate for growing crystals is immersed in the solution, and nitride crystals are grown on the substrate. The substrate for growing crystals may be formed of any material including, for example, sapphire, AlN templates, GaN templates, GaN self-supporting substrates, silicon single crystal, SiC single crystal, MgO single crystal, spinel ($MgAl_2O_4$), $LiAlO_2$, $LiGaO_2$, and perovskite complex oxides such as $LaAlO_3$, $LaGaO_3$ and $NdGaO_3$. Cubic perovskite complex oxides having the nominal composition of $[A_{1-y}(Sr_{1-x}Ba_x)_y][(Al_{1-z}Ga_z)_{1-u}■D_u]O_3$, wherein A is a rare-earth element, D is one or more element selected from the group consisting of niobium and tantalum, y is from 0.3 to 0.98, x is from 0 to 1, z is from 0 to 1, u is from 0.15 to 0.49, x+z is from 0.1 to 2, can also be used. SCAM ($ScAlMgO_4$) can also be used.

The crucible for containing the flux and the source material may be formed of any material including corrosion-resistant materials such as alumina and yttria.

The reaction vessel for containing the crucible and the intermediate vessel for containing the reaction vessel may be formed of any material as long as the material is resistant to the atmosphere and the temperature for growing crystals. The reaction vessel and the intermediate vessel may have any configuration as long as the vessels can provide an appropriate amount of an atmosphere containing a nitrogen-atom containing gas to the solution in the crucible. Preferably, those described in Patent Document 6 can be used.

The pressure vessel for containing the intermediate vessel and for containing an atmosphere that contains at least a nitrogen atom-containing gas is not critical. Although the vessel is preferably a hot isostatic pressing apparatus, the vessel may be another type of vessels for heating and pressurizing the atmosphere.

Even if the intermediate vessel contains a single reaction vessel, the present invention can reduce the variation in the growth rate of nitride crystals due to a difference in the position of the reaction vessel. In a preferred embodiment, a plurality of the reaction vessels can be placed into the intermediate vessel. This further reduces variation in the growth rate of nitride crystals in the respective crucibles in the respective reaction vessels.

The heating temperature and the pressure in the crystal growth step are selected depending on the type of the crystals and thus are not critical. The heating temperature can be, for example, 800-1500° C. The temperature is preferably 800-1200° C. and more preferably 800-1100° C. The pressure is not critical and is preferably equal to or more than 1 MPa and more preferably equal to or more than 2 MPa. The upper limit of the pressure is not critical and can be, for example, equal to or less than 200 MPa and more preferably equal to or less than 100 MPa.

In a preferred embodiment, gallium nitride single crystals are grown under an atmosphere containing a nitrogen atom-containing gas at a total pressure of 1 MPa or more and 200 MPa or less. When the total pressure was equal to or more than 1 MPa, gallium nitride single crystals of good quality could be grown in a high temperature range of, for example, 800° C. or higher and more preferably 850° C. or higher.

In a preferred embodiment, the nitrogen atom-containing gas in the growth atmosphere has a partial pressure of 1 MPa or more and 200 MPa or less. When the nitrogen atom-containing gas had a partial pressure of 1 MPa or more, dissolution of nitrogen in the flux could be promoted in a high temperature range of, for example, 800° C. or higher to grow gallium nitride crystals of good quality. In this context, the nitrogen atom-containing gas in the atmosphere more preferably has a partial pressure of 2 MPa or more. Practically, the nitrogen atom-containing gas preferably has a partial pressure of 100 MPa or less.

The nitrogen atom-containing gas is preferably nitrogen, while the gas may be, for example, ammonia. The gas other than the nitrogen atom-containing gas in the atmosphere is not critical and is preferably an inert gas and particularly preferably argon, helium, or neon. The gas other than the nitrogen atom-containing gas has a partial pressure that is determined by subtracting the partial pressure of the nitrogen atom-containing gas from the total pressure.

In the present invention, the vapor 9 of an organic compound is made present in a space 3a outside of the reaction vessels 5A-5D and inside of the intermediate vessel 3 during the crystal growth step. This inhibits oxidation of the surface of the solution in the crucible and reduces variation in the rate of crystal growth due to the difference in the positions.

In this regard, the organic compound vapor may be present in the space 1a in the pressure vessel and outside of the intermediate vessel, while the organic compound vapor may be present in the space 5a in the reaction vessel.

In a preferred embodiment, the organic compound is provided in the space outside of the reaction vessel and inside of the intermediate vessel, and the organic compound is evaporated by the heating to produce the vapor. However, a source of the organic compound vapor may be disposed outside of the pressure vessel, and the organic compound vapor, together with the atmosphere containing a nitrogen atom-containing gas, may be fed from the source into the pressure vessel to diffuse the organic compound vapor in the space in the intermediate vessel.

In a preferred embodiment, the organic compound is in liquid state at ambient temperature (25° C.). The liquid organic compound is readily evaporated by the heating to produce the vapor.

The organic compound has the property of being evaporated without carbonization under the heating and pressurizing conditions in the crystal growth step. In this context, the organic compound preferably has a boiling point of from 0 to 400° C. and more preferably from 100 to 300° C.

In a preferred embodiment, the organic compound does not contain nitrogen and sulfur. In a preferred embodiment, the organic compound consists of carbon and hydrogen and optionally a halogen atom. More preferably, the organic compound is a hydrocarbon or a halogen-containing hydrocarbon.

Examples of the hydrocarbon include aliphatic hydrocarbons, alicyclic hydrocarbons, and aromatic hydrocarbons. Examples of the aliphatic hydrocarbons include saturated or unsaturated hydrocarbons such as alkanes, alkenes, and alkynes, and the aliphatic hydrocarbons preferably have 5-20 carbon atoms. Examples of the alicyclic hydrocarbons include those having 5-8 carbon atoms, and aliphatic hydrocarbon substituted cyclopentane and cyclohexane are particularly preferred. Examples of the aromatic hydrocarbons include those having 6-10 carbon atoms, and aliphatic hydrocarbon substituted benzene is particularly preferred.

Examples of the halogen-containing hydrocarbon include halogen-containing aliphatic hydrocarbons, alicyclic hydrocarbons, and aromatic hydrocarbons. Examples of the halogen-containing aliphatic hydrocarbons include saturated or unsaturated halogen-containing hydrocarbon such as alkanes, alkenes, and alkynes, and the aliphatic hydrocarbons preferably have 5-20 carbon atoms. Examples of the halogen-containing alicyclic hydrocarbons include those having 5-8 carbon atoms. Particularly, chlorocyclohexane is preferred. Examples of the halogen-containing aromatic hydrocarbons include those having 6-10 carbon atoms, and monochlorobenzene is particularly preferred. The number of halogen substitutions may be one, or two or more. A preferred halogen is chlorine, and fluorine is particularly preferred. Even when a halogen-containing hydrocarbon is used, the halogen is not introduced as impurities into the grown crystals.

EXAMPLES

Example 1

Production of Seed Crystal Substrate

An apparatus as illustrated in FIG. 1 and FIG. 2 was used to grow gallium nitride crystals.

In particular, a low temperature GaN buffer layer was deposited to 20 nm at 530° C. on a c-plane sapphire substrate having a diameter of 2 inches and a thickness of 500 μm by a MOCVD method. Then, a seed crystal layer of GaN was deposited to a thickness of 2 μm at 1050° C. on the buffer layer. The defect density was $1\times10^9/cm^2$, as measured by TEM. After the deposited substrate was ultrasonically cleaned in an organic solvent for 10 minutes and then in ultrapure water for 10 minutes, the substrate was dried to provide a seed crystal substrate.

Growth of GaN Crystals by Liquid Phase Technique

Ga metal (source material) and Na metal (flux) were weighed in a molar ratio of 20:80 inside a glove box filled with inert gas and were placed onto the bottom of alumina crucible 6, together with the seed crystal substrate. The three of the crucibles were stacked on top of one another and placed into respective stainless-steel reaction vessels 5A-5D. The four reaction vessels 5A-5D that contained the plurality of crucibles were stacked on top of one another and placed into a stainless-steel intermediate vessel 3.

Then, 1 ml of liquid paraffin 4 was disposed on the bottom surface of the intermediate vessel 3. The disposed liquid paraffin had about 15-20 carbon atoms and a boiling point of 300° C. or higher and 400° C. or less (according to MSDS by Kanto Chemical Co., Inc.).

After the intermediate vessel 3 was placed on a turntable in a pressure tight vessel 1 that had been vacuum-baked, the pressure tight vessel 1 was covered with a lid and sealed. Then, the pressure in the pressure tight vessel 1 was reduced to a vacuum of 0.1 Pa or less by a vacuum pump. The reaction vessel and the intermediate vessel used in the experiment were those described in Patent Document 6. The intermediate vessel had a capacity of about 120 cm$^3$, which was large enough to allow all of the disposed liquid paraffin to be converted into the vapor and enough to accommodate the vapor under a pressure of 4 MPa.

Then, the heaters 2A-2C in the pressure tight vessel 1 were turned on, and the source material in the crucibles was melted to produce a Ga—Na mixed solution 8. While heating the crucibles to a temperature of 880° C., nitrogen gas was introduced from a nitrogen gas cylinder to achieve a pressure of 4.0 MPa to start growing crystals. After 5 hours, the crucible temperature and pressure were respectively adjusted to 850° C. and 4.0 MPa, and simultaneously, agitation by continuously reversing the rotation of the turntable was started to change the crystal growth mode. The turntable was rotated around the central axis at a rotation rate of 20 rpm and periodically alternated between clockwise and counterclockwise rotations as rotation conditions. The acceleration time was 12 seconds, the retention time was 600 seconds, the deceleration time was 12 seconds, and the down time was 0.5 seconds. After such conditions were maintained for 10 hours, the system was allowed to cool to room temperature, and the grown gallium nitride crystal substrate was collected.

Gallium nitride grown on the seed crystal substrate by using twelve crucibles 6 stacked on top of one another had a minimum thickness of about 45 micrometer, a maximum thickness of about 67 micrometer, a mean thickness of 51 micrometer, and a standard deviation of 5 micrometer, indicating that there was a small variation in the thickness. The surface of the substrate having the gallium nitride crystals thereon was polished to reduce the thickness to 15 micrometer, and then the dark spot density was determined to be $2\times10^7/cm^2$ by cathodoluminescence.

The gallium nitride layer on the sapphire substrate was used to produce a rectangular, lateral type blue LED chip having dimensions of 1 mm by 1 mm. The LED chip driven at a current of 350 mA had a high internal quantum efficiency of about 80%.

Example 2

An experiment was conducted similar to Example 1 except that monochlorobenzene (1 ml) was used in place of liquid paraffin. Monochlorobenzene had a boiling point of 131.7° C. and a melting point of −45.6° C. and is in liquid state at room temperature (according to MSDS by Kanto Chemical Co., Inc.).

Gallium nitride grown on the seed crystal substrate by using 12 crucibles stacked on top of one another had a minimum thickness of about 40 micrometer, a maximum thickness of about 65 micrometer, and a mean thickness of 50 micrometer (standard deviation: 6 micrometer), indicating that gallium nitride crystals having a variation similar to the variation in Example 1 could be grown. Measurement of the resultant crystals by SIMS showed that the concentration of chlorine was equal to or below the detection limit ($2\times10^{14}/cm^3$), confirming that use of a halogen-containing hydrocarbon does not lead to incorporation of halogen as impurities into the grown crystals.

Comparative Example 1

An experiment was conducted similar to Example 1 except that liquid paraffin was not used. Gallium nitride grown on the seed crystal substrate by using 12 crucibles stacked on top of one another had a minimum thickness of about 35 micrometer, a maximum thickness of about 57 micrometer, and a mean thickness of 45 micrometer, indicating that the growth thickness is slightly smaller than the thickness in Example 1. This suggests that the sodium metal, which was the source material, was slightly oxidized. The standard deviation of the thickness was 9 micrometer, and thus the variation in the growth thickness was larger than the variation in Example 1. This suggests that the variation in actual temperature in the respective crucibles was larger than the variation in Example 1.

Comparative Example 2

An experiment was conducted similar to Example 1 except that liquid paraffin as described in Example 1 was added to the crucibles in an amount of 0.5 mol %. Gallium nitride grown on the seed crystal substrate by using 12 crucibles stacked on top of one another had a minimum thickness of about 60 micrometer, a maximum thickness of about 95 micrometer, and a mean thickness of 78 micrometer, indicating that the growth thickness was larger than the thickness in Example 1. However, the surface was highly uneven, and the crystals were not smoothly grown.

The crystals were abnormally grown on the perimeter of the seed substrate. The abnormal growth means protrusive facets. In particular, aggregates of crystals with a developed m-plane were attached. The abnormal growths were black colored, and the surface of the growths could not be smoothed by abrasive removal. The standard deviation of the thickness was 12 micrometer, and the variation in the growth thickness was larger than the variation in Example 1. This suggests that the variation in actual temperature in the respective crucibles was larger than the variation in Example 1.

Comparative Example 3

An experiment was conducted similar to Example 1 except that paraffin wax was used in place of liquid paraffin. The paraffin wax was molten and carbonized at elevated temperatures. When the intermediate vessel 3 was collected upon completion of the growth, char, which might be the carbonized paraffin wax, was observed on the bottom surface of the vessel 3. Gallium nitride grown on the seed crystal substrate by using 12 crucibles stacked on top of one another had a minimum thickness of about 40 micrometer, a maximum thickness of about 60 micrometer, and a mean thickness of about 47 micrometer, indicating that the growth thickness was slightly smaller than the thickness in Example 1. This suggests that the sodium metal, which was the source material, was slightly oxidized. The standard deviation of the thickness was 9 micrometer, indicating that the variation in the growth thickness was larger than the variation in Example 1. This suggests that the variation in actual temperature in the respective crucibles was larger than the variation in Example 1.

The invention claimed is:

1. A method of producing a crystal of a nitride of a Group 13 element using a solution comprising a flux and a source material, the method comprising:

using a crucible containing said flux and said source material, a reaction vessel containing said crucible, an intermediate vessel containing said reaction vessel, and a pressure vessel containing said intermediate vessel and used to fill at least nitrogen gas; and melting said flux and said source material by heating and introducing said nitrogen gas into said pressure vessel under a pressurized state, said nitrogen gas being supplied into said solution in said crucible through said intermediate vessel and said reaction vessel to grow said crystal of said nitride of said Group 13 element, wherein a vapor of an organic compound is supplied into a space outside of said reaction vessel and inside of said intermediate vessel, said organic compound having a molecular weight greater than that of nitrogen.

2. The method of claim 1, wherein said organic compound is disposed in said space outside of said reaction vessel and inside of said intermediate vessel, and wherein said organic compound is evaporated by said heating to supply said vapor of said organic compound into said space outside of said reaction vessel and inside of said intermediate vessel.

3. The method of claim 1, wherein said organic compound is in liquid state at a room temperature.

4. The method of claim 1, wherein a plurality of said reaction vessels are placed in said intermediate vessel.

5. The method of claim 1, wherein said organic compound comprises a hydrocarbon or a halogen-containing hydrocarbon.

6. The method of claim 1, comprising providing a source of supplying said vapor of said organic compound outside of said pressure vessel and supplying said vapor into said pressure vessel with said nitrogen gas from said source to supply said vapor of said organic compound into said space outside of said reaction vessel and inside of said intermediate vessel.

* * * * *